(12) United States Patent
Egashira

(10) Patent No.: US 7,240,680 B2
(45) Date of Patent: Jul. 10, 2007

(54) SUBSTRATE PROCESSING APPARATUS

(75) Inventor: Koji Egashira, Tosu (JP)

(73) Assignee: Tokyo Electron Limited, Tokyo-to (JP)

( * ) Notice: Subject to any disclaimer, the term of this patent is extended or adjusted under 35 U.S.C. 154(b) by 171 days.

(21) Appl. No.: 10/446,438

(22) Filed: May 28, 2003

(65) Prior Publication Data

US 2003/0221713 A1    Dec. 4, 2003

(30) Foreign Application Priority Data

May 28, 2002  (JP) .............................. 2002-153708

(51) Int. Cl.
*B08B 3/00* (2006.01)
(52) U.S. Cl. ...................... 134/159; 134/158; 134/902; 134/149
(58) Field of Classification Search ................ 134/112, 134/137, 157–159, 149, 165, 184, 186, 188, 134/902, 140, 78, 117, 26, 57 R; 206/710, 206/711; 34/58
See application file for complete search history.

(56) References Cited

U.S. PATENT DOCUMENTS

| | | | | |
|---|---|---|---|---|
| 5,452,795 A | * | 9/1995 | Gallagher et al. | ........... 206/711 |
| 6,062,239 A | * | 5/2000 | Bexten | ....................... 134/25.4 |
| 6,082,540 A | * | 7/2000 | Krampotich et al. | ........ 206/445 |
| 6,334,453 B1 | * | 1/2002 | Thompson et al. | ......... 134/140 |
| 6,370,791 B1 | * | 4/2002 | Weaver et al. | .................. 34/58 |
| 6,516,816 B1 | * | 2/2003 | Husain et al. | .............. 134/95.3 |
| 6,536,452 B1 | * | 3/2003 | Kohama et al. | ............. 134/117 |
| 6,568,412 B2 | * | 5/2003 | Egashira | ...................... 134/159 |
| 6,589,359 B2 | * | 7/2003 | Kamikawa et al. | ........... 134/26 |
| 6,776,173 B2 | * | 8/2004 | Kamikawa | ................. 134/57 R |
| 6,871,655 B2 | * | 3/2005 | Davis et al. | ................... 134/78 |
| 2002/0113027 A1 | * | 8/2002 | Minami et al. | ........... 211/41.18 |

FOREIGN PATENT DOCUMENTS

JP            07-201802        8/1995

* cited by examiner

*Primary Examiner*—Michael Barr
*Assistant Examiner*—Sarah E. Husband
(74) *Attorney, Agent, or Firm*—Morrison & Foerster, LLP

(57) ABSTRACT

A substrate processing apparatus includes a rotor 45 for rotating a plurality of wafers W paralleled each other at appropriate intervals. While rotating the wafers W by the rotor 45, a chemical liquid is supplied to the wafers W for their processing. The rotor 45 has holding members 95, 96, 97, 98, 99 for holding the peripheries of the wafers W in parallel arrangement and a press member 100 for holding the wafers W while applying a pressure on their peripheries. Irrespective of rotation of the rotor 45, the press member 100 always applies a pressure on the peripheries of the wafers W so as to prevent the peripheries from sifting with respect to the holding members 95, 96, 97, 98, 99. With the action of the press member 100, it becomes possible to prevent the peripheries of the wafers W from being worn and also possible to elongate the span of life of the holding members 95, 96, 97, 98, 99 while performing a chemical processing.

11 Claims, 12 Drawing Sheets

SUBSTRATE PROCESSING APPARATUS

BACKGROUND OF THE INVENTION

1. Technical Field of the Invention

This invention relates to a substrate processing apparatus for cleaning a substrate, for example, semiconductor wafer, glass for LCD substrate, etc.

2. Description of the Related Art

For example, in the manufacturing process of semiconductor devices, there is employed a substrate processing apparatus that sprays a processing liquid (e.g. chemical liquid, deionized water) to semiconductor wafers, which will be called as "wafers" hereinafter, thereby to remove contaminants, for example, particles, organic contaminants, etc. from the wafers. As such a substrate processing apparatus, there is known a substrate processing apparatus that includes a rotor accommodating a plurality of wafers (e.g. twenty six wafers) at appropriate intervals. The rotor is provided with a plurality of parallel holding rods (e.g. six rods). Each of the holding rods has twenty six holding grooves formed at appropriate intervals in the longitudinal direction to hold the peripheries of twenty six wafers. By six holding rods of the rotor, each wafer is held at six positions about the periphery stably. Being retained in twenty six holding grooves of each holding rod respectively, twenty six wafers are arranged in parallel with each other at appropriate intervals in the rotor. By spraying chemical liquid etc. while rotating the wafers accommodated in the so-constructed rotor, particles etc. can be removed from the wafers uniformly.

In the conventional substrate processing apparatus, however, when accelerating or decelerating the rotation of a rotor, the rotating speed of the wafers does not follow the rotating speed of the rotor, so that a phenomenon of the wafers' slipping in the holding grooves arises. Consequently, the peripheries of the wafers are worn to produce particles. Further, the abrasion of holding grooves due to the above slipping requires a frequent exchange of the holding rods.

In order to solve the above problem, it has been supposed to employ a piece adapted to apply pressure on the periphery of a wafer by making use of a centrifugal force. However, sufficient pressure could not be produced unless the revolutions of a rotor becomes high. Noted that the above piece is formed by an elastic member, such as rubber, in view of making sure of holding the wafer. However, the elastic member does not have the property of chemical-resistance and heat-resistance enough to process the wafer with chemicals.

SUMMARY OF THE INVENTION

Under such a circumference as mentioned above, an object of the present invention is to provide a substrate processing apparatus that can prevent abrasion of the peripheries of the substrates, expand the span of life of the holding rods and perform the chemical processing for the substrates.

The first feature of the present invention resides in a substrate processing apparatus which includes a rotor for rotating a plurality of substrates paralleled each other at proper intervals, for processing the substrates while rotating the substrates by the rotor, the rotor of the substrate processing apparatus comprising: at least one holding member for holding the peripheries of the substrates in parallel arrangement; and at least one press member that is constructed so as to always apply a pressure on the peripheries of the substrates irrespective of rotary and stationary state of the rotor, thereby holding the substrates so as to prevent the peripheries of the substrates from shifting with respect to the holding member. In this case, even when accelerating or decelerating the rotation of the rotor, it is possible to avoid the peripheries of the substrates from being worn to produce particles. In addition, the abrasion of the holding member is prevented to expand its span of life.

The second feature of the invention resides in that the press member includes a plurality of pressure pieces arranged corresponding to the substrates respectively, and a rod for supporting the pressure pieces in a row. Then, in comparison with the processing of the plural pressure pieces and the rod formed in one body, it is possible to enhance the processing accuracy of the pressure pieces, thereby reducing the manufacturing cost.

The third feature of the invention resides in that each of the pressure pieces has an abutting part for abutment on the periphery of the substrate and a deformable part capable of elastic deformation, and is constructed so that the movement of the abutting part due to pressing of the periphery of the substrate produces a deflection of the deformable part to produce the pressure of the press member.

The fourth feature of the invention resides in that the abutting part has a substantial-V shaped groove formed to enable the periphery of the substrate to be inserted thereinto, thereby holding the substrate.

The fifth feature of the invention resides in that the abutting part is formed with a frictional coefficient that does not produce shift between the periphery of the substrate and the holding member.

The sixth feature of the invention resides in that each of the pressure pieces is formed so as to enable an amount of the deflection to be adjusted.

The seventh feature of the invention resides in that the abutting part is arranged on the opposed side of a position where the substrates are loaded and unloaded to and from the rotor. Then, in loading the substrates, it is possible to insert the peripheries of the substrates into the substantial-V shaped grooves of the abutting parts. In unloading the substrates, it is possible to extract the peripheries of the substrates from the substantial-V shaped grooves.

The eighth feature of the invention resides in that each of the pressure pieces further has a guide part to guide the periphery of the substrate before the V-shaped groove guides the periphery of the substrate to the abutting part.

The ninth feature of the invention resides in that each of the pressure pieces further has an abutting face for abutting on the periphery of the substrate.

The tenth feature of the invention resides in that each of the pressure pieces has at least one drain hole for discharging liquid from the circumference of the rod due to a centrifugal force with the rotation of the rotor.

The eleventh feature of the invention resides in that the substrate processing apparatus further comprises a stopper that restricts the rotation of the pressure pieces.

The twelfth feature of the invention resides in that each of the pressure pieces has at least one drain hole for discharging liquid from the circumference of the stopper with the rotation of the rotor, due to a centrifugal force thereof.

The thirteenth feature of the invention resides in that each of the pressure pieces has at least one drain hole for discharging liquid from an interval between the periphery of the substrate and the pressure piece with the rotation of the rotor, due to a centrifugal force thereof.

The fourteenth feature of the invention resides in that the pressure pieces are juxtaposed in a row while allowing opposing side faces of the adjoining pressure pieces abut on each other, and each of the side faces has at least one drain groove for discharging liquid from the circumference of the rod. Consequently, for example, when drying the substrates in rotation, it is possible to discharge liquid from the press member smoothly, whereby a period of drying can be shortened.

The fifteenth feature of the invention resides in that the pressure pieces are made with the property of chemical-resistance.

The sixteenth feature of the invention resides in that the pressure pieces are made with the property of heat-resistance.

The seventeenth feature of the invention resides in that the holding member is provided as a plural, and at least one of the holding members is a movable holding member capable of moving between its opening position that allows the substrates to be loaded and unloaded to and from the rotor and the closing position that allows the substrates to be retained in the rotor.

The eighteenth feature of the invention resides in that the press member is arranged at the opposite position to the movable holding member across the center of the rotor.

The nineteenth feature of the invention resides in that the press member includes a rod extending in a direction to arrange the substrates and a pressure piece fitted to the rod, and the pressure piece includes apiece body cylindrically shaped so as to surround the rod and extending in the direction to arrange the substrates and a plurality of deformable parts formed to project from the piece body in correspondence with the substrates, the deformable parts being deformable against the piece body.

The twentieth feature of the invention resides in that the piece body has an abutting face for abutment on the peripheries of the substrates, and the deformable parts are provided, at respective tips thereof, with abutting parts for pressing the peripheries of the substrates.

DESCRIPTION OF THE PREFERRED EMBODIMENT

Figure 1:
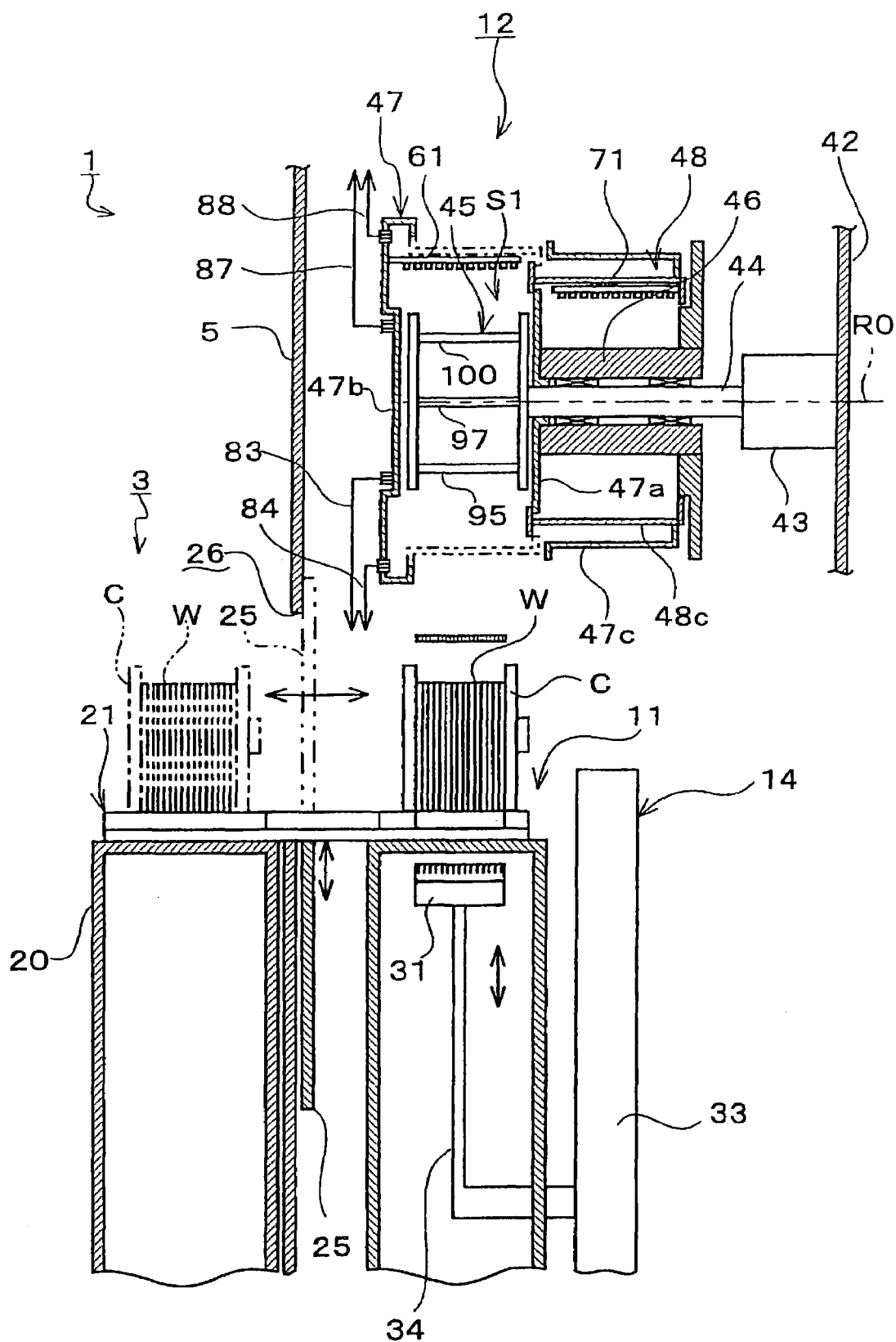
FIG. 1 is a sectional view of a cleaning unit installing a substrate processing apparatus of an embodiment of the present invention and a stage part.

Preferred embodiments of the present invention will be described on the basis of a substrate processing apparatus that is constructed so as to clean a plurality of wafers as an example of substrate. FIG. 1 shows a cleaning unit 1 of a cleaning system, which includes a substrate processing apparatus 12 in accordance with one embodiment of the invention.

In FIG. 1, the cleaning system includes a cleaning unit 1 for applying a chemical process and the sequent drying process to the wafers W and a stage part 3 to load a carrier C to the cleaning unit 1 and unload the carrier C therefrom. A vertical partition 5 is arranged between the cleaning unit 1 and the stage part 3.

The cleaning unit 1 includes a carrier standby part 11 for making the carrier C wait in readiness for charging (or discharging), a substrate processing apparatus 12 of the embodiment, which is arranged above the carrier standby part 11, and a wafer moving mechanism 14 for moving the wafers W between the carrier C made to wait in readiness in the carrier standby part and the substrate processing apparatus 12 vertically.

The stage part 3 has a stage 20 for mounting the carrier C thereon and a carrier transfer mechanism 21 for moving the carrier C horizontally to load it to the cleaning unit 1 and unload the carrier C therefrom. In the carrier C that has been transferred from a not-shown container loading/unloading part of the cleaning system to the stage 20, a plurality of wafers W (e.g. 26 pieces) are accommodated at appropriate intervals, vertically.

The partition 5 is provided with an opening 26 that is closable by a shutter 25. In loading the carrier C to the cleaning unit 1 or unloading the carrier C therefrom, the shutter 25 is opened so that the carrier C and the carrier transfer mechanism 21 can pass through the opening 26.

In the carrier C that has been transferred from the stage 20 to the carrier standby part 11 through the opening 26, a plurality of wafers W are accommodated in vertical arrangement. In operation, the wafer moving mechanism 14 allows a wafer holding member 31 to enter the carrier C in the carrier standby part 11 from the underside. Next, while maintaining the vertical arrangement of the wafers W at regular intervals, they are pushed up by the wafer holding member 31. With a further elevation of the wafer holding member 31, the wafers W are loaded into the substrate processing apparatus 12 located above. When discharging the wafers W from the apparatus 12, the wafer holding member 31 receives the wafers W and successively moves down while maintaining the vertical arrangement of the wafers W at regular intervals. Subsequently, the wafers W are accommodated in the carrier C, while the wafer holding member 31 further moved down through the carrier C. Noted that the wafer holding member 31 is secured on the top of an elevating member 34 driven up and down by an elevating mechanism 33. Thus, the wafer holding member 31 can move up and down with the ascent and descent of the elevating member 34 in a vertical direction.

Figure 2:
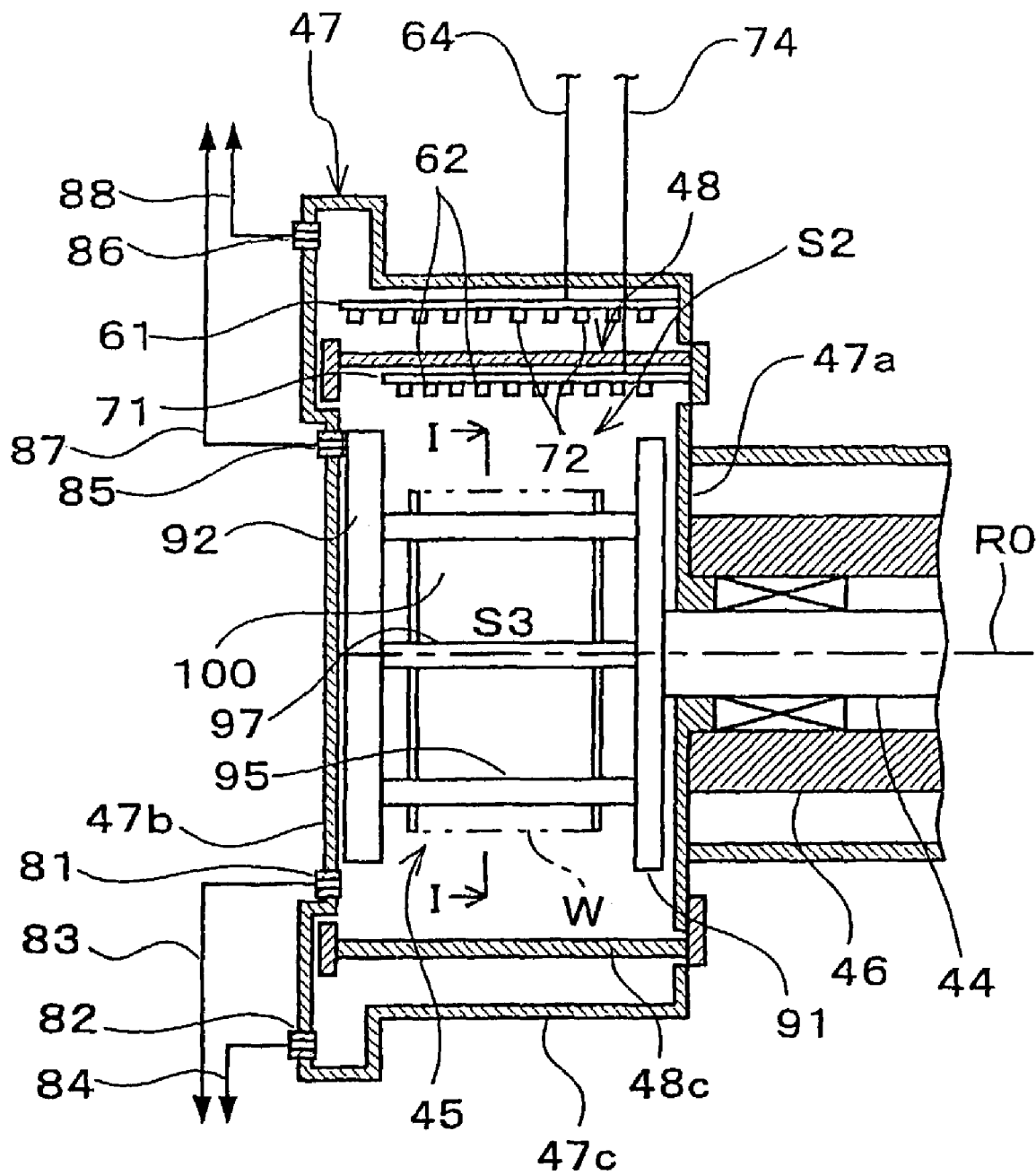
FIG. 2 is a sectional view of the substrate processing apparatus, showing a state that an inner chamber is withdrawn into an outer chamber.

As shown in FIGS. 1 and 2, the substrate processing apparatus 12 comprises a vertical support wall 42, a motor 43 fixed to the wall 42 and having a rotating axis RO extending horizontally, a rotating shaft 44 of the motor 43, a rotor 45 attached to the leading end of the rotating shaft 44, a cylindrical casing 46 surrounding the rotating shaft 44, an outer chamber 47 supported by the casing 46 so as to surround the rotor 45 and an inner chamber 48 moving inside the outer chamber 47 to accomplish a chemical processing while surrounding the rotor 45.

The rotating shaft 44 of the motor 43 penetrates a vertical wall 47a of the outer chamber 47 near the motor 43 through not-shown bearings and projects into the outer chamber 47. The leading end of the rotating shaft 44 is connected with the rear part of the rotor 45. At the center of the vertical wall 47a, a not-shown seal mechanism is provided to seal up a clearance between the wall 47a and the rotating shaft 44.

The rotor 45 retains a plurality of substantial-disc shaped wafers W (e.g. 26 pieces) in vertical arrangement, paralleled to each other at regular intervals in the horizontal direction. The center of each wafer W held by the rotor 45 is positioned on the rotating axis RO of the motor 43 and also the rotating shaft 44. When the rotor 45 is rotated by the motor 43 through the rotating shaft 44, the rotor 45 can rotate in integral with the wafers W. The structure of the rotor 45 will be described later.

The outer chamber 47 includes an outer cylinder 47c arranged outside the rotor 45 through a predetermined gap. Noted that when loading the wafers W to the rotor 45, the outer cylinder 47c withdraws to the right of FIG. 1 to stand ready while surrounding the casing 46.

The inner chamber 48 includes an inner cylinder 48c having a diameter smaller than that of the outer cylinder 47c of the outer chamber 47. The inner cylinder 48c is movable between the chemical processing position of FIG. 1 and the withdrawal position of FIG. 2. As shown in FIG. 1, when the inner cylinder 48c is in the withdrawal position outside the outer chamber 47, a processing space S1 is formed by the outer chamber 47. While, as shown in FIG. 2, when the inner cylinder 48c is in the chemical processing position inside the outer chamber 47, another processing space S2 is formed by the inner cylinder 48c and the vertical walls 47a, 47b. Noted that the processing spaces S1 and S2 are provided as sealed spaces by seal mechanisms. Thus, for example, both of the chemical process and the sequent shaking process (both mentioned later) are carried out in the processing space S2, while both of the rinsing process and the drying process are carried out in the processing space S1.

On the upside of the space S1, two ejection nozzles 61 are arranged so as to extend along a cylinder axis of the outer cylinder 47c forming the longitudinal direction. Each ejection nozzle 61 is equipped with a number of ejection orifices 62 juxtaposed in the direction of the cylinder axis. The ejection nozzles 61 are connected with a supply pipe 64, whereby deionized water (DIW) as a rinsing liquid is supplied from a not-shown water source to the nozzles 61 through the pipe 64 and further ejected against the wafers W from each ejection orifices 62. Additionally, IPA vapor is also supplied from a not-shown IPA source to the nozzles 61 through the pipe 64 and further ejected against the wafers W from each ejection orifices 62.

On the upside of the space S2, two ejection nozzles 71 are arranged so as to extend along a cylinder axis of the inner cylinder 48c forming the longitudinal direction. Each ejection nozzle 71 is equipped with a number of ejection orifices 72 juxtaposed in the direction of the cylinder axis. As shown in FIG. 2, the ejection nozzles 71 are connected with a chemical supply pipe 74, whereby a chemical liquid is supplied from a not-shown chemical source to the nozzles 71 through the pipe 74 and further ejected against the wafers W from each ejection orifice 72.

On the lower part of the vertical wall 47b on the leading side of the outer chamber 47, a first drain port 81 is arranged to discharge the used chemical liquid from the processing space S2. Below the first drain port 81, a second drain port 82 is arranged to discharge the used water etc. from the processing space S1. The first drain port 81 and the second drain port 82 are connected with a first drain pipe 83 and a second drain pipe 84, respectively.

On the upper part of the vertical wall 47b, a first exhaust port 85 is arranged to exhaust the processing space S2. Above the first exhaust port 85, a second exhaust port 86 is arranged to exhaust the processing space S1. The first exhaust port 85 and the second exhaust port 86 are connected with a first exhaust pipe 87 and a second exhaust pipe 88, respectively.

Figure 3:
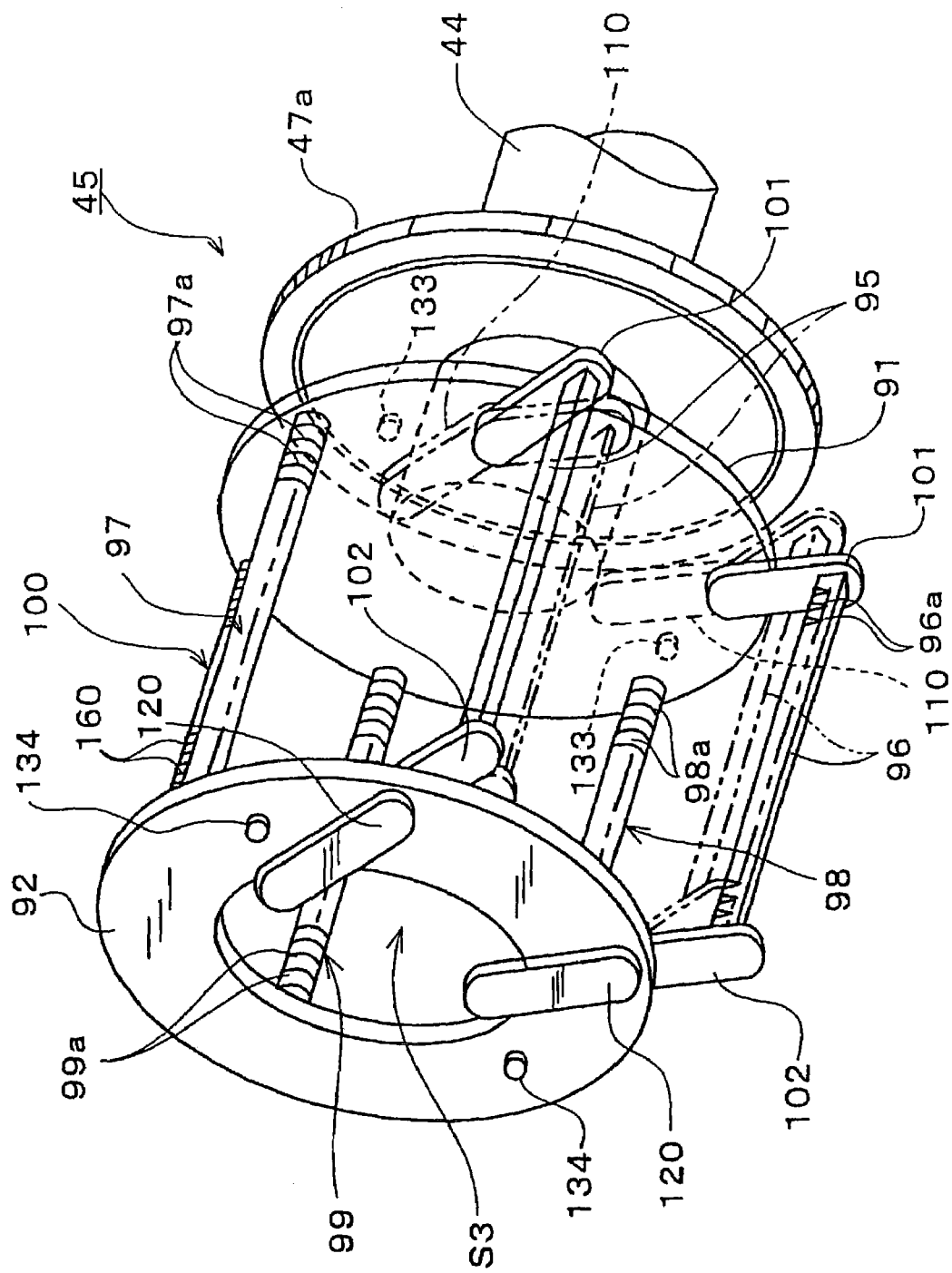
FIG. 3 is a perspective view of a rotor of the substrate processing apparatus.

Next, the structure of the rotor 45 will be described. FIG. 3 is a perspective view showing the schematic structure of the rotor 45. In FIG. 3, the rotor 45 has a pair of circular disks 91, 92 arranged at a predetermined interval so as to enable insertion of twenty six wafers W. The disk 91 is arranged on the side of the vertical wall 47a of the outer chamber 47 near the motor 43 and fixed to the leading end of the rotating shaft 44. While, the other disk 92 is arranged on the side of the vertical wall 47b of the outer chamber 47 near its leading end. Further, between the opposing disks 91, 92 in pairs, six holding rods 95, 96, 97, 98 and 99 are arranged to hold the peripheries of the wafers W cooperatively. These rods 95, 96, 97, 98 and 99 are arranged in a circumference about the rotating axis RO as the center of the circumference and also paralleled to each other in the horizontal direction. Further, a holding rod 100 as a press member to apply a pressure on the peripheries of the wafers W held by the holding rods 95 to 99 is arranged in parallel with the rods 95 to 99.

Figure 4:
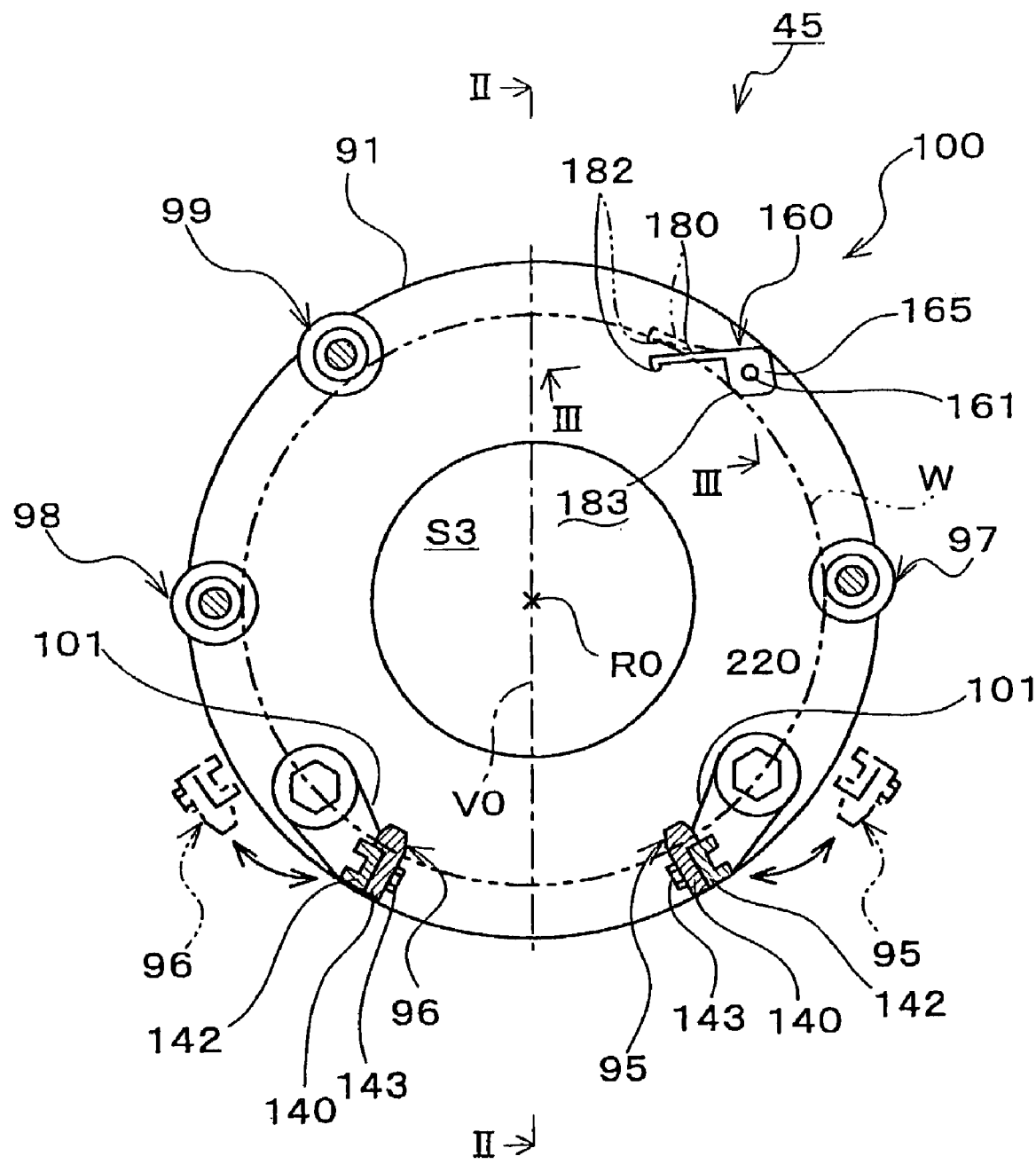
FIG. 4 is a sectional view taken along a line I—I of FIG. 2.

FIG. 4 is a sectional view of the rotor 45 taken along a line I—I of FIG. 2, showing the postures of the rotor 45 to insert the wafers W into the rotor 45 and withdraw the wafers W therefrom. A space surrounded by the holding rods 95 to 100 provides a space S3 for retaining the wafers W therein. Since the rods 95 to 100 hold the peripheries of the wafers W inserted into the rotor 45, the wafers W are retained in the rotor 45 in their upright postures. In both loading the wafers W into the rotor 45 and unloading them from the rotor 45, the holding rods 95, 96 are moved below the wafers W. As shown in FIG. 4, in a state viewing the rotor 45 (at loading/unloading the wafers W) from the side of the vertical wall 47b, the holding rods 95, 96 respectively abut on the right and left lower parts of the wafers W retained in the space S3, the right and left lower parts being symmetrical to each other about a vertical line VO perpendicular to the rotating axis RO. Then, the holding rods 97, 98 respectively abut on the right and left intermediate parts of the wafers W, the right and left intermediate parts being symmetrical to each other about the rotating axis RO. The holding rod 99 abuts on the left upper parts of the wafers W, while the holding rod 100 abuts on the right upper parts of the wafers W.

Further, the holding rods 95, 96, 97, 98 and 99 are provided with twenty six holding grooves 95a, 96a, 97a, 98a and 99a at regular intervals, respectively. When making the holding rods 95, 96, 97, 98 and 99 hold the peripheries of the wafers W, the right upper parts of the wafers W, the left upper parts, the right intermediate parts, the left intermediate parts, the right lower parts and the left lower parts are inserted into the holding grooves 95a, 96a, 97a, 98a and 99a, respectively. With this arrangement, twenty six wafers W can be retained in parallel with each other, at regular intervals.

First, the structure of the holding rod 95 for holding the right lower parts of the wafers W will be described. As shown in FIG. 3, the disks 91, 92 are respectively equipped, on right lower parts thereof, with arms 101, 102 that can swing with respect to the disks 91, 92 on the side of the holding space S3. The holding rod 95 has its both ends supported by the arms 101, 102, respectively.

Figure 5:
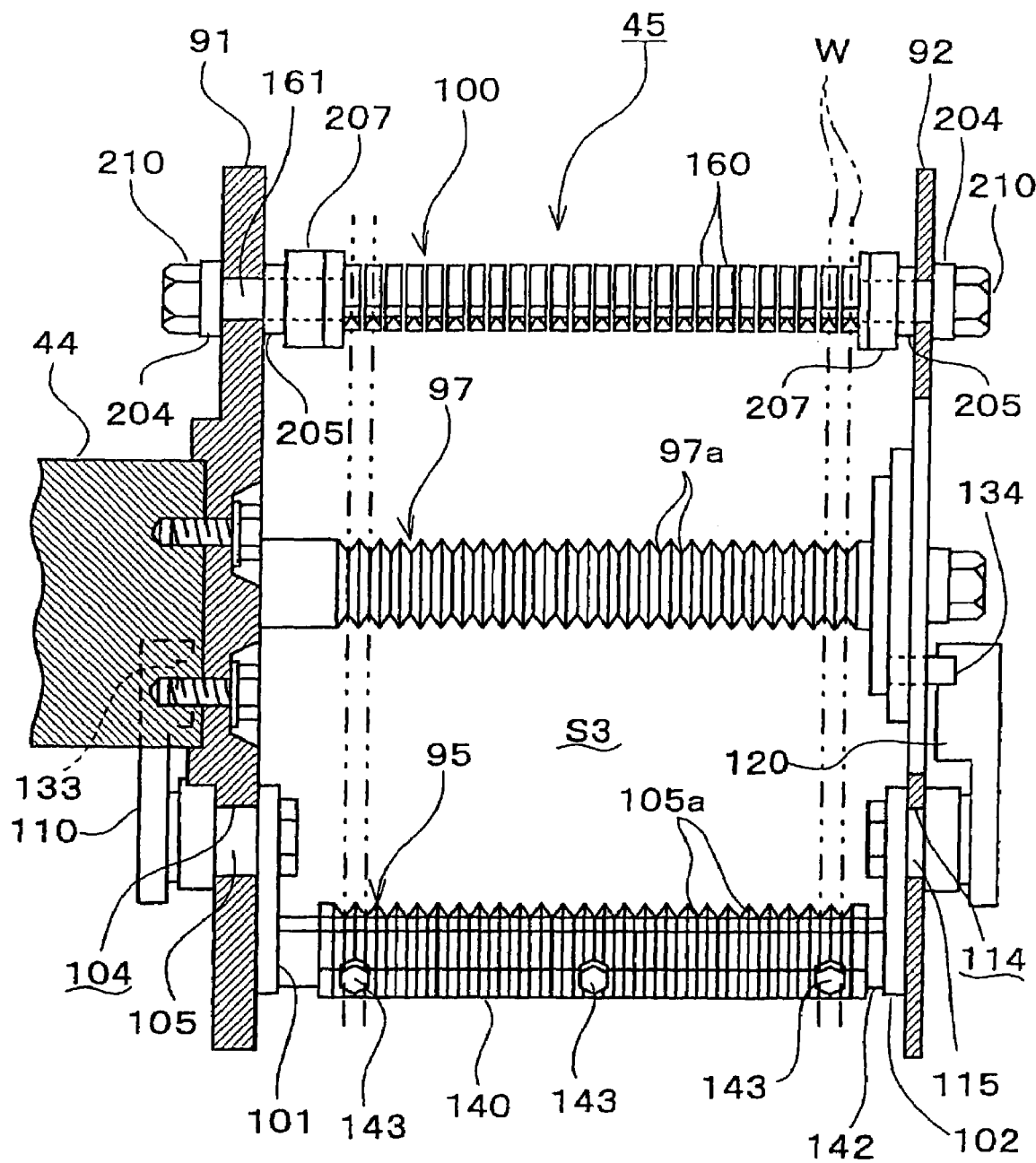
FIG. 5 is a sectional view taken along a line II—II of FIG. 4.

FIG. 5 is a sectional view of the rotor 45, taken along a line II—II of FIG. 4, showing the constitutions of the rods 95, 97 and 100. As shown in FIG. 5, on the right side of the disk 91, it has a connecting hole 104 formed to penetrate the lower portion of the disk 91 to a horizontal center line thereof. A rotational connecting shaft 105 is rotatably fitted in the connecting hole 104. A balance weight 110 is secured, on its lower end (base end), with the end of the rotational connecting shaft 105 on the side of the rotating shaft 44. The upper end (base end) of the arm 101 is fixed to the rotational connecting shaft 105 on the side of the holding space S3. While, the lower end (leading end) of the arm 101 is secured to the end of the holding rod 95.

On the right side of the disk 92, it has a connecting hole 114 formed to penetrate the lower portion of the disk 92 to the horizontal center line. A rotational connecting shaft 115 is rotatably fitted in the connecting hole 104. Outside the holding space S3, a balance weight 120 is secured, on its lower end (base end), with the right end of the rotational connecting shaft 115. The upper end (base end) of each arm 102 is fixed to the rotational connecting shaft 115 on the side of the holding space S3. While, the lower end (leading end) of the arm 102 is secured to the other end of the holding rod 95.

When respective tips of the balance weights 110, 120 move to the outside of the disks 91, 92 respectively, the rotational connecting shafts 105, 115 rotate to make the leading ends of the arms 101, 102 move to the interior side of the disks 91, 92, whereby the holding rod 95 abuts on the peripheries of the wafers W.

Lock pins 133, 134 are formed to project on the outside faces of the disks 91, 92 apart from the holding space S3 respectively, preventing the balance weights 110, 120 from moving outside excessively. Thus, there is no possibility that the holding rod 95 presses the peripheries of the wafers W with an excessive force. Additionally, the lock pins 133, 134 serve as stoppers to prevent the balance weights 110, 120 from abutting on the inner walls of the outer chamber 47 and the inner chamber 48 due to their excessive outward displacements.

Figure 6:
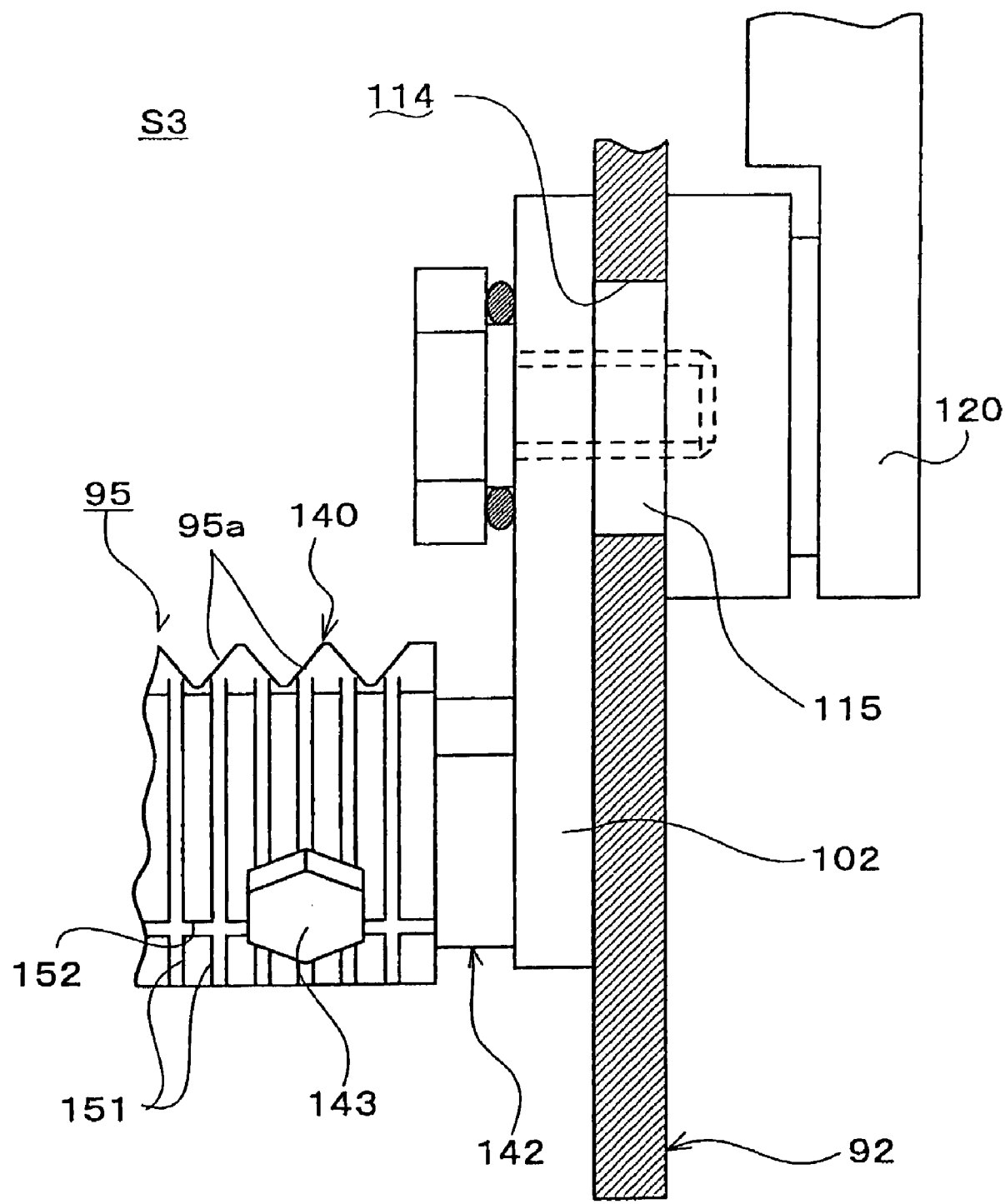
FIG. 6 is a sectional view showing the structure where the rotor supports an openable and closable holding rod in enlargement.

FIG. 6 shows the connection of the holding rod 95 with the arm 102 in enlargement. The holding rod 95 has a holding groove member 140 having twenty six holding grooves 95a formed at regular intervals in the longitudinal direction and an attachment member 142 for supporting the holding groove member 140. The attachment member 142 has its one end secured to the leading end of the arm 102, as shown in FIG. 6. Similarly, The other end of the attachment member 142 is secured to the leading end of the arm 101. The holding groove member 140 is attached to the attachment member 142 by attachment bolts 143 at several points of the member 140 in the longitudinal direction.

In FIG. 6, the holding grooves 95a are formed on the upper face of the holding groove member 140. With a substantial-V shaped section, each groove 95a is formed so as to hold the periphery of the wafer W since it is inserted between opposing slanted faces of the groove 95a to abut the peripheral edges of both faces of the wafer W on the slanted faces.

On the side face of the holding groove member 140, a plurality of drain grooves 151 are formed to extend in the radial direction of the wafers W. As shown in FIG. 6, the drain grooves 151 are formed so as to pass the center of the attachment bolt 143 and also both sides thereof. Further, a drain groove 152 is formed so as to stride across the drain grooves 151 in the horizontal direction. With this formation, it is possible to discharge liquid collected around the attachment bolts 143 from the drain grooves 151 smoothly. The drain grooves 151, 152 are further formed on respective contact faces between the holding groove member 140 and the attachment member 142, so that liquid collected between the member 140 and the attachment member 142 can be discharged from the drain grooves 151 smoothly.

The holding rod 96 for holding the left lower parts of the wafers W has a structure in symmetry with that of the above-mentioned holding rod 95 about the vertical line VO of FIG. 4. As shown in FIG. 3, similarly to the lower right sides of the disks 91, 92, the swing arms 101, 102 are arranged on the lower left sides of the disks 91, 92, respectively. The holding rod 96 has its both ends supported by the arms 101, 102 respectively.

The respective balance weights 110 of the holding rods 95, 96 are moved between the outside and inside of the disk 91 by a not-shown switching mechanism on the side of the rotating shaft 44. Thus, the holding rods 95, 96 can approach each other and separate from each other about the vertical line VO of FIG. 4 as the center. When the wafers W are loaded into the rotor 45 by the wafer moving mechanism 14 as wafer loading/unloading means and when the wafers W are unloaded from the rotor 45 by the mechanism 14, the holding rods 95, 96 open. An interval between the holding rods 95, 96 in the opened state provides a charging/withdrawal position for the wafers W. In holding the wafers W inserted into the holding space S3, the holding rods 95, 96 are together closed to hold the right and left lower parts of the wafers W. The rotor 45 can rotate under condition of closing the holding rods 95, 96.

Since the holding rods 97, 98 and 99 are provided with the same structures, the structure of the holding rod 97 will be described representatively. The holding rod 97 supporting the intermediate right parts of the wafers W of FIG. 4 is arranged to bridge between the intermediate right parts of the disks 91, 92, as shown in FIG. 5. On the periphery of the holding rod 97, twenty six holding grooves 97a are formed to hold the peripheries of the wafers W at regular intervals in the longitudinal direction of the rod 97. With a substantial-V shaped section, each of the grooves 97a holds the periphery of the wafer W since it is inserted between opposing slanted faces of the groove 97a to abut the peripheral edges of both faces of the wafer W on the slanted faces.

Figure 8:
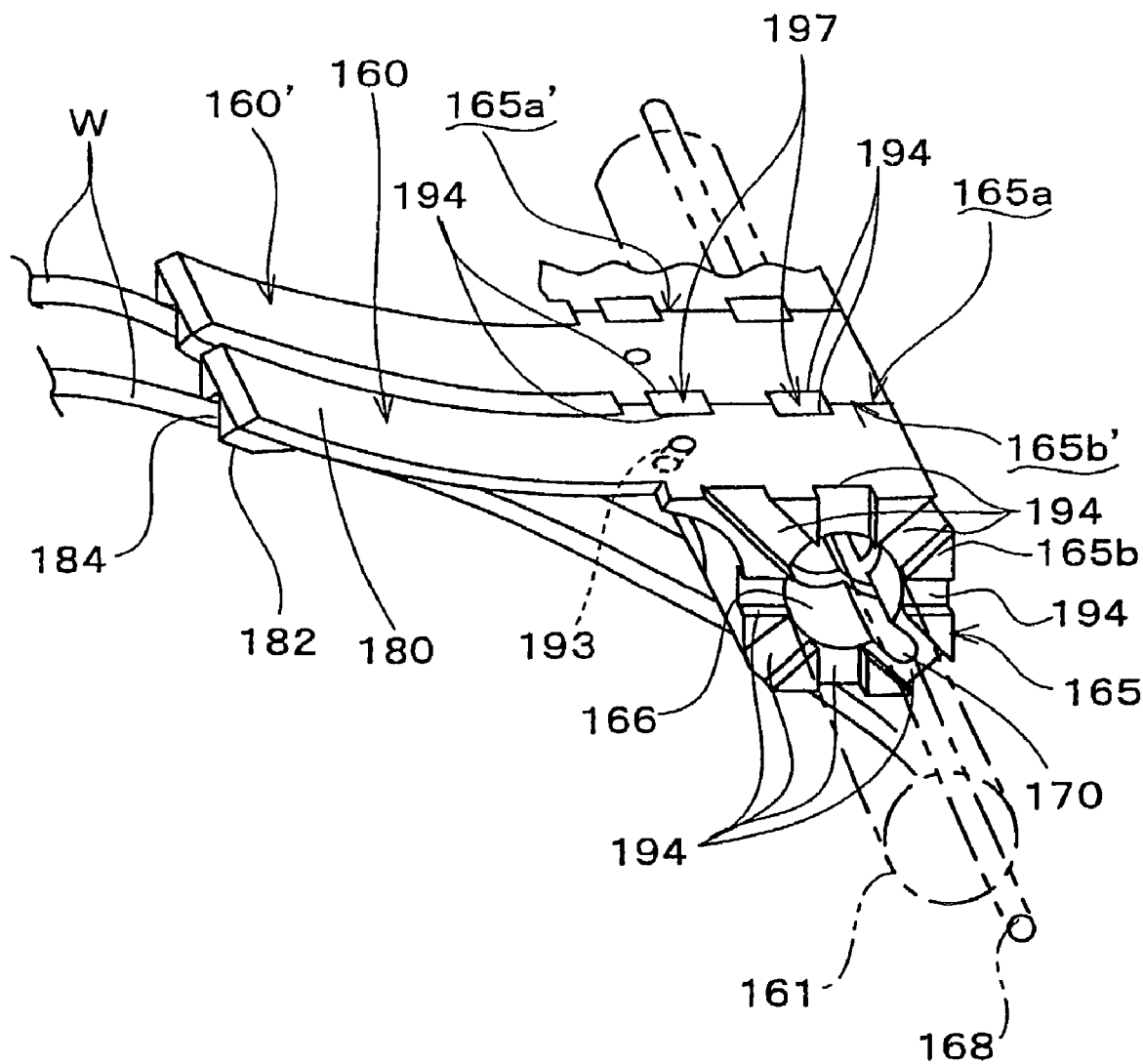
FIG. 8 is a perspective view explaining a state that the pressure pieces are juxtaposed while abutting on wafers.

In FIG. 4, the holding rods 98, 99 holding the upper parts (left side) and the intermediate parts (left side) of the peripheries of the wafers W are arranged to bridge the intermediate parts (left side) of the disks 91, 92 and the upper parts (left side) of the disks 91, 92 respectively, as similar to the holding rod 97 of FIG. 5. On the peripheries of the holding rods 98, 99, twenty six holding grooves 98a, 99a are formed to hold the peripheries of the wafers W at regular intervals in the longitudinal direction of the rods 98, 99, respectively. Next, the structure of the holding rod 100 as the press member will be described. The holding rod 100 includes twenty six pressure pieces 160 provided corresponding to twenty six wafers W to apply pressures on the peripheries of the wafers W respectively, and a rod 161 for supporting the pressure pieces 161. As shown in FIGS. 5 and 8, twenty six pressure pieces 160 are juxtaposed in the longitudinal direction of the rod 161 while making respective side faces 165*a*, 165*b* of piece bodies 165 in contact with each other. Both ends of the rod 161 are fixed to the disks 91, 92 respectively.

Figure 7A:
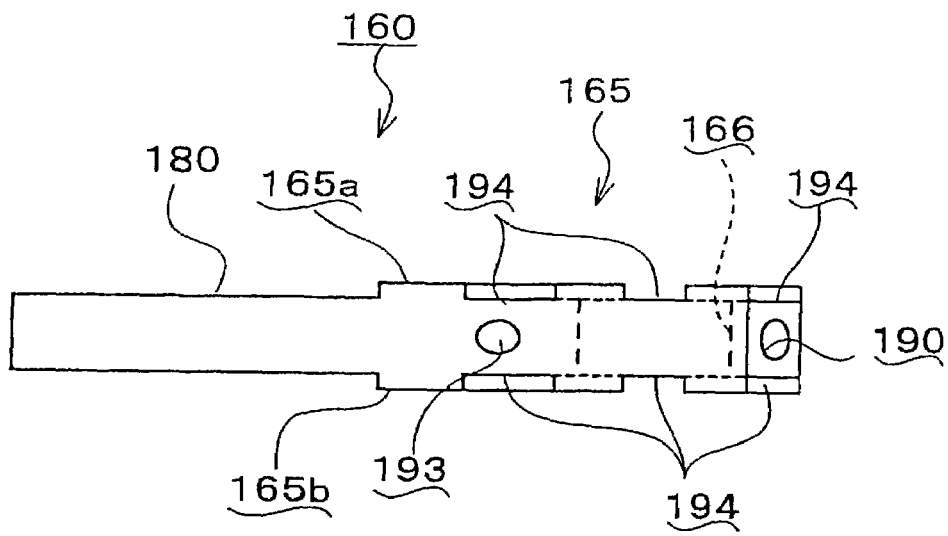
FIG. 7A is a plan view of a pressure piece.

As shown in FIG. 7, in each of the pressure pieces bodies 165 of the pressure pieces 160, a rod fitting hole 166 penetrates the piece body 165 to fit with the rod 161. Further penetrating the piece body 165, a stopper insert hole 170 is formed to allow a stopper 168 to be inserted thereinto. The stopper 168 serves to prevent the pressure pieces 160 from rotating about the rod 161.

Figure 7B:
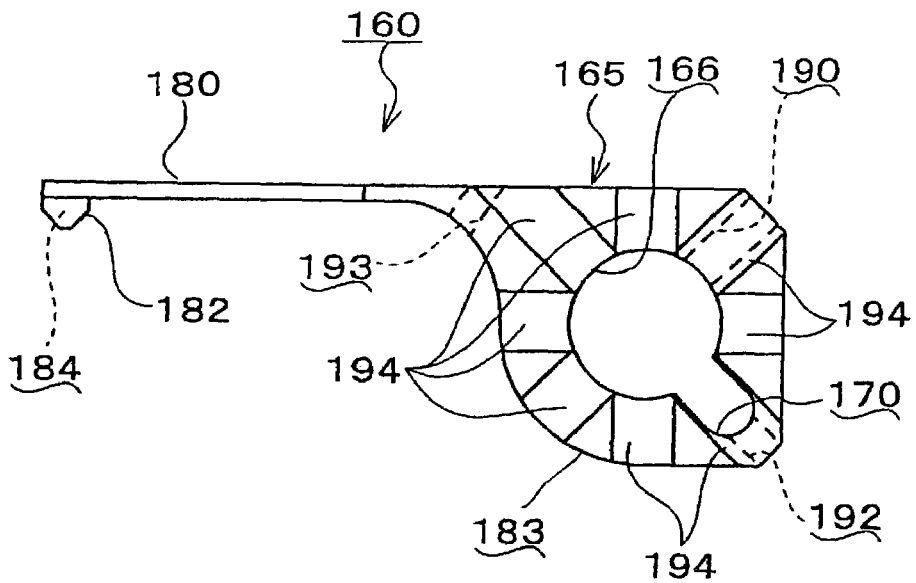
FIG. 7B is a side view of the pressure piece.

Additionally, a beam-shaped deformable part 180 is formed to project from the piece body 165. The deformable part 180 is provided, at a tip thereof, with an abutting part 182 for abutment on the periphery of the wafer W. For example, the center axis of the deformable part 180 is perpendicular to the center axis of the rod 161. Further, the deformable part 180 is shaped to have a rectangular cross section of, for example, about 5 mm in width and 1 mm in height. In FIG. 7B, the outer circumferential face (lower left side) of the piece body 165 is formed in a curve to provide a abutting face 183 for abutting on the periphery of the wafer W.

Figure 7C:
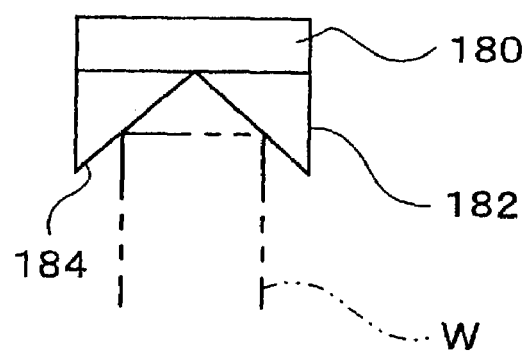
FIG. 7C is a front view showing a contact part of the pressure piece in enlargement.

In FIG. 7B, on the lower face of the abutting part 182, a holding groove 184 is formed to have a substantial-V shaped section opening downward. As shown in FIG. 7C, in the holding state, the periphery of the wafer W is inserted between slanted faces of the holding groove 184 opposing in a V-shaped manner so that the peripheral edges on both sides of the wafer W abut on the slanted faces.

The pressure pieces 160 are arranged in the rotor 45 so that the abutting parts 182 and the abutting faces 183 face the holding space S3, as shown in FIG. 4. In the arrangement of FIG. 4 where the pressure pieces 160 are positioned on the upper right side of the wafers W at loading/unloading them, the pressure pieces 160 are arranged so that the abutting parts 182 are closer to the tops of the wafers W than the piece bodies 165. That is, the abutting parts 182 are adapted so as to abut on the vicinities of the tops of the wafers W at loading/unloading. Here, with the opening and closing of the holding rods 95, 96, the lower part of the holding space S3 provides a loading/unloading position to load/unload the wafers W to and from the rotor 45, while the abutting parts 182 are positioned on the opposite side of the loading/unloading position of the rotor 45. In loading the wafers W into the rotor 45 through its underside of the rotor 45, since the wafers W are elevated toward the abutting parts 182 through the loading/unloading position, the above arrangement of the abutting parts 182 allows the peripheries of the wafers W to be inserted into the holding grooves 184 from the underside of the rotor 45 smoothly. Similarly, in discharging the wafers W from the rotor 45, since the wafers W are lowered toward the loading/unloading position below the rotor 45, the above arrangement of the loading/unloading position allows the peripheries of the wafers W to be withdrawn from the holding grooves 184 downward smoothly.

When elevating the wafers W from the loading/unloading position, the peripheries of the wafers W are inserted into the holding grooves 184 respectively. This insertion of the peripheries of the wafers W into the holding grooves 184 causes the abutting parts 182 to be urged by the peripheries of the wafers W, so that deflections arise in the deformable parts 180 as a result of relative displacements between the piece bodies 165 and the abutting parts 182. Due to the deflections of the deformable parts 180, there are produced forces for the abutting parts 182 to urge the peripheries of the wafers W against their respective centers.

Each pressure piece 160 consisting of the piece body 165, the deformable part 180 and the abutting part 182 is formed in one body of e.g. PEEK (polyether-ether-ketone). In case of adopting the material PEEK, the pressure piece 160 can be provided with both chemical-resistance and heat-resistance enough for the chemical processing of the wafers W. Further, it becomes possible to accomplish the elastic deformation of the deformable part 180, whereby the forces required to press the wafers W to the holding grooves 95*a*, 96*a*, 97*a*, 98*a* and 99*a* can be produced. Owing to the adoption of the material PEEK, the pressure piece 160 can be provided with a frictional coefficient that would not make a displacement between the holding groove 184 of the abutting part 182 and the periphery of the wafer W.

In each pressure pieces 160, the piece body 165 is provided with a drain hole 190 for discharging liquid from the circumference of the rod 161. The drain hole 190 penetrates the piece body 165 from the inner face of the rod fitting hole 166 up to the outer face of the body 165. With the formation of the drain hole 190, the rotation of the rotor 45 allows the liquid collected between the inner face of the rod fitting hole 166 and the rod 161 to be discharged from the drain hole 190 to the outside of the rotor 45, due to a centrifugal force of the rotor 45.

In addition, the piece body 165 is provided with a drain hole 192 for discharging liquid from the circumferential area of the stopper 168. The drain hole 192 also penetrates the piece body 165 from the inner face of the stopper inserting hole 170 up to the outer face of the body 165. With the formation of the drain hole 192, the rotation of the rotor 45 allows the liquid collected between the inner face of the stopper inserting hole 170 and the stopper 168 to be discharged from the drain hole 192 to the outside of the rotor 45, due to the centrifugal force of the rotor 45.

In the shown example, the stopper inserting hole 170 is provided in the form of a U-sectional groove that opens the inner face of the rod fitting hole 166, while the drain hole 192 opens the interior face of the stopper inserting hole 170. The stopper inserting hole 170 is communicated with the drain hole 192 in the radial direction of the rod 161. Therefore, the drain hole 192 is also capable of discharging the liquid from the rod fitting hole 166 owing to the centrifugal force of the rotor 45.

Further, the piece body 165 is provided with a drain hole 193 for discharging liquid from the interval between the periphery of the wafer W and the pressure piece 160 due to the centrifugal force of the rotor 45. In FIG. 7B, the drain hole 193 also penetrates the piece body 165 from the outer face of the base part of the deformable part 180 up to the top of the pressure piece 160. With this arrangement of the drain hole 193, it is possible to discharge the liquid from a space surrounded by the outer face of the piece body 165, the outer face of the deformable part 180 and the periphery of the wafer W, smoothly. With the formation of the drain hole 193, the rotation of the rotor 45 allows the liquid collected between the periphery of the wafer W and the pressure piece 160 to be discharged from the drain hole 193 out of the rotor 45, due to the centrifugal force of the rotor 45.

Noted that the pressure piece 160 may be provided with drain holes as a plural for each of the drain holes 190, 191 and 193 in the modification. For instance, the pressure piece 160 may includes a plurality of drain holes 190 each extending in the radial direction about the rod fitting hole 166 as a center.

On both of the side faces 165a, 165b of the piece body 165, one or more drain grooves 194 are formed to discharge the liquid from a gap between the piece body 165 and the adjoining pressure piece 160. The drain groove(s) 194 extends in the radial direction of the rod fitting hole 166 as the center and also communicates the periphery of the rod fitting hole 166 with the outer edge of the piece body 165. In the shown example, eight drain grooves 194 are formed so as to extend in the radial direction of the hole 166. The drain grooves 194 on the side faces 165a, 165b of the pressure piece 160 are arranged in symmetry with each other. That is, when the rod 161 supports a plurality pressure pieces 160 in the adjoining manner, the side face 165b of the pressure piece 160 comes into contact with the side face 165b' of the adjoining pressure piece 160', as shown in FIG. 8. Consequently, the drain grooves 194 of the side face 165a are communicated with the drain grooves 194 of the side face 165b' to form drain paths 197. The resulting drain paths 197 extend from the rod 161 to the outer faces of the neighboring piece bodies 165, allowing the liquid collected about the circumference of the rod 161 to be discharged outside.

Figure 9:
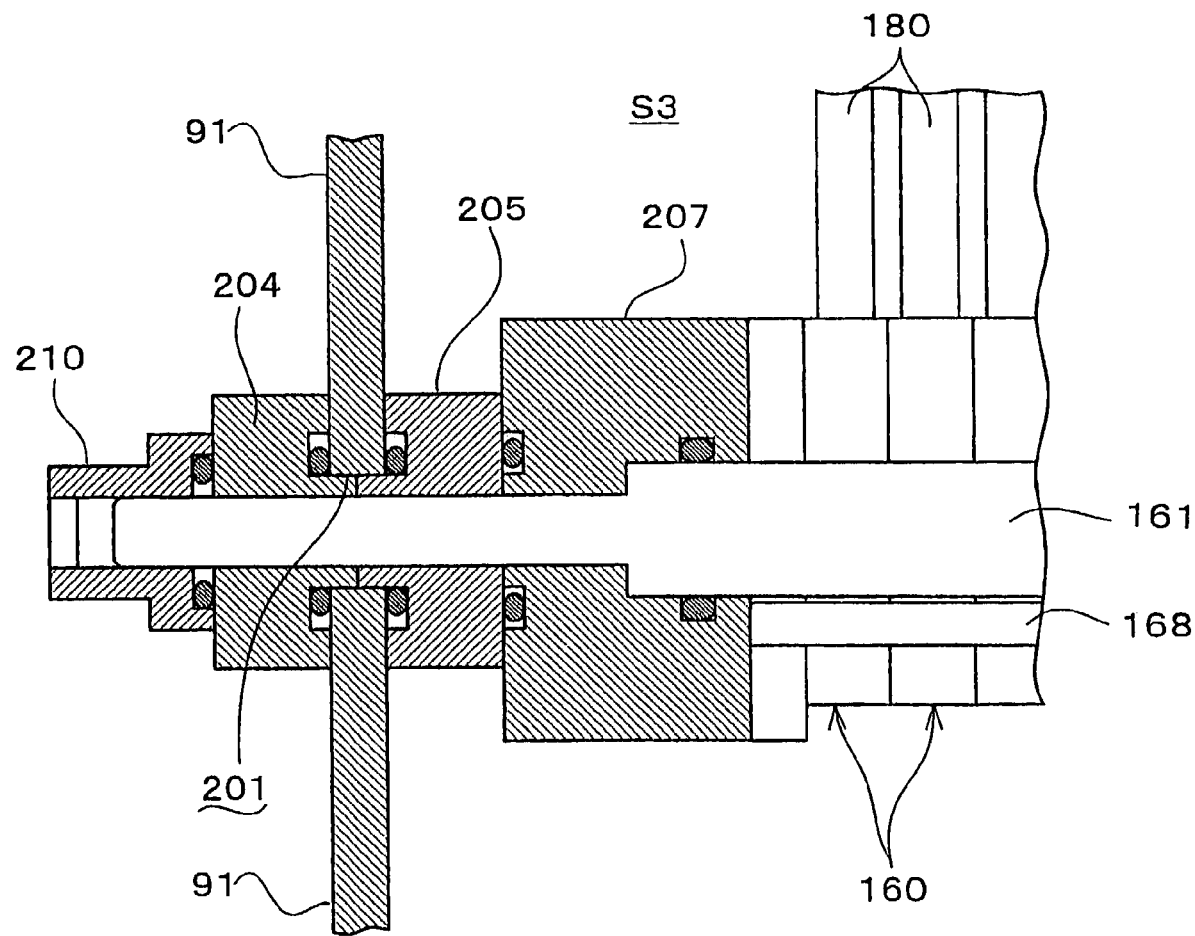
FIG. 9 is a sectional view taken along a line III—III of FIG. 4, showing the structure where the rotor supports a holding rod as the press member in enlargement.

As shown in FIG. 9, the disk 91 is provided, on the upper right side (in FIG. 4), with a through hole 201 enabling penetration of the rod 161. On the exterior side of the disk 91 corresponding to the outside of the holding space S3, a fixing member 204 is arranged to fill up the through hole 201 from the exterior side of the disk 91. On the interior side of the disk 91 corresponding to the holding space S3, a fixing member 205 is arranged to fill up the through hole 201 from the interior side of the disk 91. Further, another fixing member 207 is arranged between the fixing member 205 and the pressure piece 160. Through respective insides of the fixing members 207, 205 and 204, the rod 161 projects out of the fixing member 204. The leading end of the rod 161 projecting from the fixing member 204 is screwed into a cap nut 210. The leading end of the stopper 168 comes into contact with the inside face of the fixing member 207. As shown in FIG. 5, the other disk 92 is also provided with various elements similar to those of the disk 91 (i.e. another through hole 201, fixing members 204, 205 and 207, another cap nut 210).

If tightening the cap nuts 210 provided for the disks 91, 92 respectively, the leading ends of the stopper 168 are fixed to the inside faces of the fixing members 207 and the side faces 165a, 165b are forced to each other. Consequently, even if the deformable parts 180 of the pieces 160 have deflections, the piece bodies 165 are brought into immovable condition in relation to the rod 161. Conversely, if loosening the cap nuts 210 respectively, then it becomes possible to displace the leading ends of the stopper 168 with respect to the inside faces of the fixing members 207. Thus, it is possible to adjust an inclination of the center axis of each deformable part 180 in its vertical direction.

When processing the wafers W rotating at improved acceleration or deceleration, it is carried out to change the inclination of the center axis of each deformable part 180 to a direction to increase its deflection, thereby increasing a pressure of the abutting part 182 acting on the periphery of the wafer W. Consequently, since the periphery of each wafer W is respectively pressed against the holding grooves 184, 95a, 96a, 97a, 98a, 99a and the abutting face 183 harder, it is possible to set maximum static frictional forces between the periphery of the wafer W and the holding grooves 184, 95a, 96a, 97a, 98a, 99a and the abutting face 183 up as larger values respectively. Therefore, without producing any deviation of the peripheries of the wafers W from the holding grooves 184, 95a, 96a, 97a, 98a, 99a and the abutting face 183, it is possible to rotate the wafers W and the rotor 45 in one body. In this way, owing to the proper establishment of an inclination of the center axis of each deformable part 180 corresponding to the maximum rotational acceleration and deceleration in processing the wafer W, it is possible to usually perform a processing without producing any deviation of the peripheries of the wafers W from the holding grooves 184, 95a, 96a, 97a, 98a, 99a and the abutting face 183.

Further, since there is defined a slight clearance between the stopper inserting hole 170 of each pressure piece 160 and the stopper 168, it is possible to fine-tune the inclinations of the center axes of the deformable parts 180 individually. Therefore, irrespective of respective fluctuations in the shape of the deformable parts 180, the position of the holding grooves 184, 95a, 96a, 97a, 98a, 99a and the abutting face 183 and the shape of the holding grooves 184, 95a, 96a, 97a, 98a, 99a and the abutting face 183, the individual fine-tuning of the pressures of the abutting parts 182 on the peripheries of the wafers W allows the maximum static frictional forces against the wafers W to be set up as predetermined values.

Next, we describe a substrate processing method while using the above-constructed substrate processing apparatus 12, in accordance with the embodiment of the present invention. It is firstly carried out to mount a carrier C including twenty six wafers W on the stage 20. Next, the carrier transfer mechanism 21 loads the carrier C into the cleaning unit 1 through the opening 26. Then, the carrier C stands in readiness for processing in the carrier standby part 11, while the shutter 25 is closed to seal up the opening 26.

In the substrate processing apparatus 12, thereafter, it is carried out to evacuate the outer cylinder 47c of the outer chamber 47 and the inner cylinder 48c of the inner chamber 48 to a position to surround the casing 46. Next, the not-shown drive cylinder moves the holding rods 95, 96 to their opening positions to open the holding space S3.

In succession, the wafer holding member 31 of the wafer transfer mechanism 14 rises to push up twenty six wafers W out of the carrier C, so that the wafers W are inserted into the holding space S3 of the rotor 45 through the interval between the holding rods 95, 96. Then, the peripheries of the wafers W are inserted into the holding grooves 184 of the abutting parts 182 in the vicinity of the top of the holding space S3 smoothly. Consequently, the abutting parts 182 are raised by the peripheries (upper ends) of the wafers W, thereby causing the deformable parts 180 to be deformed.

Thereafter, the not-shown switching mechanism moves the holding rods 95, 96 to their closing positions to close the holding space S3. After inserting the peripheries of the wafers W into the holding grooves 184, 95a, 96a, 97a, 98a and 99a, the wafer holding member 31 is lowered and withdrawn from the holding space S3. In this way, there is established a condition that twenty six wafers W in the holding space S3 are carried by the holding rods 95, 96, 97, 98, 99 and 100 at appropriate intervals. At this time, the vicinities of the top ends of the wafers W held by the holding rod 100 are subjected to forces to press the wafers W downward. Owing to the pressures (pushing forces), the peripheries of the wafers W are urged against the holding grooves 96a, 97a, 98a, 99a and 100a, so that the wafers W are held so as not to produce any deviation between the peripheries and the holding rods 95 to 100 certainly.

Further, it is carried out to arrange the outer cylinder 47c and the inner cylinder 48c outside the rotor 45 equipped with the wafers W. In detail, as shown in FIG. 2, the inner chamber 48 is drawn into the outer chamber 47 to form the processing space S2 in hermetically closed condition.

Next, the rotation of the rotor 45 is started and accelerated from its resting state to a predetermined rotating speed. In this way, as the abutting parts 182 of the holding rod 100 apply the pressures on the peripheries of the wafers W even when the rotor 45 is accelerated, the peripheries of the wafers W are urged against the holding grooves 184, 95a, 96a, 97a, 98a, 99a and the abutting face 183, thereby suppressing the wafers W from slipping. While holding the wafers W so as not to produce any deviation between the peripheries of the wafers W and the holding rods 95 to 100, it is possible to rotate the wafers W and the rotor 45 integrally. On the other hand, a chemical liquid is ejected from the ejection nozzle 71 and sprayed against the rotating wafers W. As a result, contaminations adhering to the wafers W (e.g. particles, organic contaminants) are removed from the wafers W.

After completing the chemical processing, the wafers W are rotated at a higher speed than that at the chemical processing to shake the chemical liquid from the wafers W due to the centrifugal force of the rotation. Then, the chemical liquid and particles adhering to the holding rods 100 are discharged from the drain holes 190, 192, 193 and the drain path 197 smoothly. Further, liquids adhering to the holding rods 95, 96 (e.g. chemical liquid, rinsing liquid) are discharged from the drain grooves 151, 152 by the centrifugal force smoothly. Thus, it is possible to perform the shaking operation effectively. When accelerating the rotor 45 to a higher speed than that at the chemical processing, the application of pressure from the abutting parts 182 to the peripheries of the wafers W allows them to be rotated without producing any deviation between the peripheries of the wafers W and the holding rods 95 to 100.

After completing the shaking operation, the inner cylinder 48c is withdrawn from the inside of the outer cylinder 47c to the outside of the casing 46 to form the processing space S1 in the outer chamber 47. Next, the deionized water is ejected from the ejection nozzle 61 to the wafers W in the rinsing operation. At the rinsing process, the rotor 45 rotates at a lower speed than that at the shaking operation. Even when decelerating the rotor 45 from the high-speed rotation at the shaking operation to the low-speed rotation at the rinsing process, the application of pressure from the abutting parts 182 to the peripheries of the wafers W allows them to be rotated without producing any deviation between the peripheries of the wafers W and the holding rods 95 to 100.

After rinsing the wafers W, the spin drying process is started. In the drying process, it is carried out to blow inert gas (e.g. nitrogen gas), volatile and hydrophilic IPA vapor, etc. to the wafers W while rotating them at a higher speed (e.g. 800 rpm) than that at the rinsing process. When accelerating the rotor 45 from the low-speed rotation at the rinsing process to the high-speed rotation at the spin drying process, the application of pressure from the abutting parts 182 to the peripheries of the wafers W allows them to be rotated without producing any deviation between the peripheries of the wafers W and the holding rods 95 to 100. In this drying operation, liquids (e.g. chemical liquid, rinsing liquid) adhering to the holding rod 100 are discharged from the drain holes 190, 192, 193 and the drain path 147 by the centrifugal force smoothly. Further, liquids (e.g. chemical liquid, rinsing liquid) adhering to the holding rods 95, 96 are discharged from the drain grooves 151, 152 by the centrifugal force smoothly. Therefore, it is possible to perform the drying operation effectively.

After completing the drying process, the rotation of the rotor 45 is stopped. Also then, since the abutting parts 182 apply the pressure to the peripheries of the wafers W, it is possible to decelerate the rotation of the wafers W to a standstill while holding the wafers W without producing any deviation between the peripheries of the wafers W and the holding rods 95 to 100. Next, the outer cylinder 47c is withdrawn to a position to surround the inner cylinder 48c and the casing 46 and then, the wafer holding member 31 is elevated to support the underside of the wafers W held by the rotor 45. Thereafter, the holding rods 95, 96 are moved to their opening positions by the not-shown switching mechanism and thereupon, the wafers W are delivered to the wafer holding member 31. Then, with the lowering of the wafer holding member 31, the wafers W are evacuated from the holding space S3. As for this evacuation, owing to the arrangement inside the rotor 45 where the peripheries of the wafers W have been inserted into the holding grooves 184 of the abutting parts 182 from below, it is possible to smoothly extract the peripheries of the wafers W from the holding grooves 184 when lowering the wafers W.

In this way, the wafers W discharged from the substrate processing apparatus 12 are accommodated in the carrier C on the carrier standby part 11 again and further discharged from the cleaning unit 1.

According to the substrate processing apparatus 12, by exerting pressure to the peripheries of the wafers W, it is possible to prevent them from slipping in the holding grooves 184, 95a, 96a, 97a, 98a and 99a during the rotation of the wafers W. Further, at the wafers' accelerating and decelerating, the pressure is applied on the peripheries of the wafers W, preventing their slipping. Accordingly, there is no possibility that the peripheries of the wafers W are worn away. Additionally, since the abrasion of the holding grooves 184, 95a, 96a, 97a, 98a and 99a is suppressed, it is possible to extend the span of life of the holding rods 95, 96, 97, 98, 99 and 100. As the inclinations of the pressure pieces 160 supported by the rod 161 are adjustable individually, it is possible to realize the application of appropriate pressures on the peripheries of the wafers W respectively. Again, it is possible to accomplish the smooth insertion and extraction of the peripheries of the wafers W to and from the holding grooves 184.

Further, since the pressure pieces are made of material PEEK, it is possible for the pressure pieces to generate enough pressures to prevent the occurrence of deviations about the wafers W. Additionally, it is possible to make the pressure pieces have both chemical-resistance and heat-resistance enough for the holding rods for a substrate processing apparatus for chemical processing.

The present invention is not limited to the above-mentioned preferred embodiment only. For example, the substrates are not limited to semiconductor wafers only. Then, the semiconductors of the embodiment may be replaced with other substrates, for example, LCD substrate glasses, CD substrates, print baseplates, ceramic substrates, etc. The present invention is not limited to substrate processing apparatus and method for cleaning substrates with chemicals. Thus, the invention is also applicable to substrate processing apparatus and method for applying the other processing except cleaning on substrates with various processing liquids.

Figure 10:
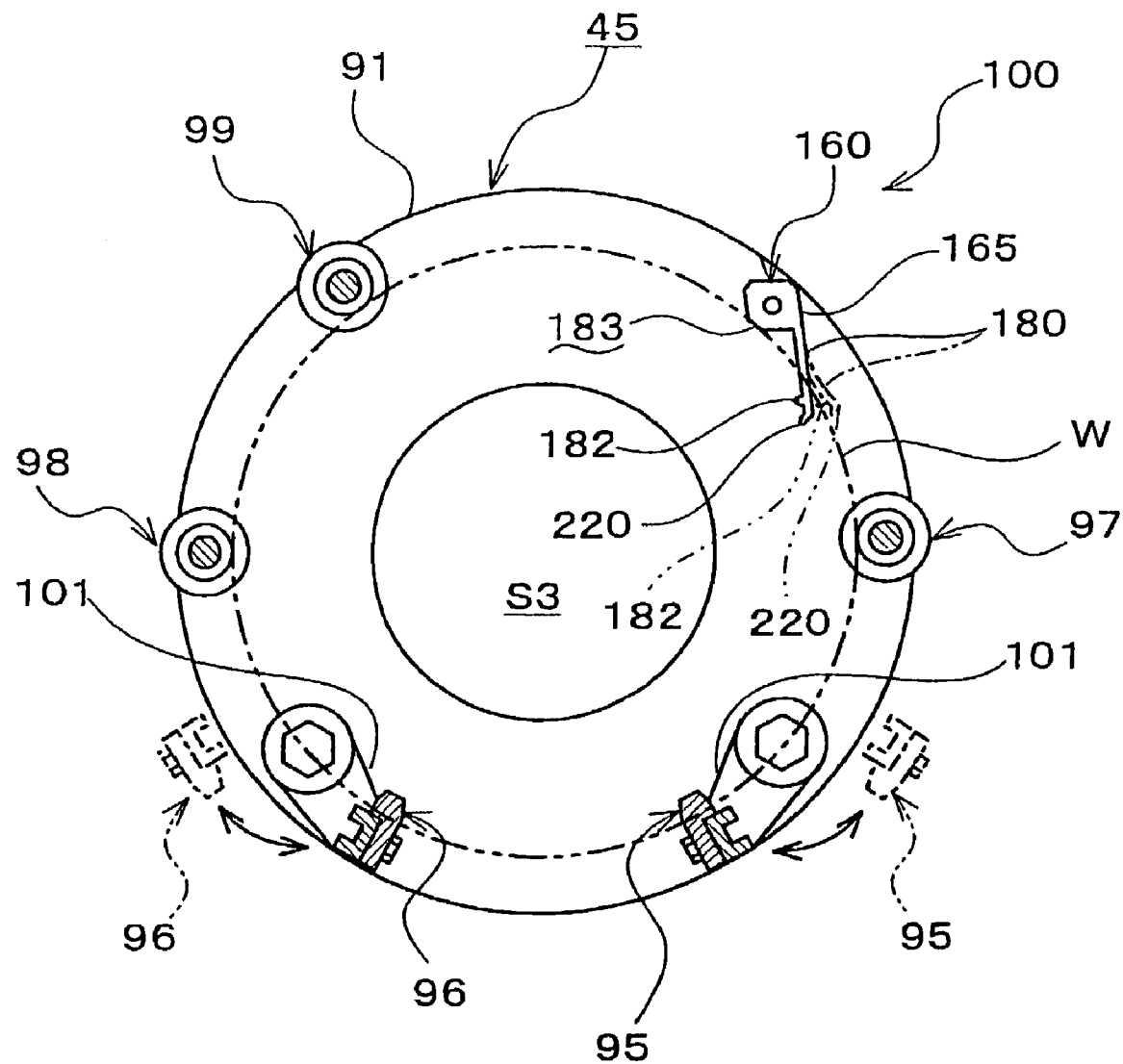
FIG. 10 is a sectional view of the rotor in accordance with another embodiment of the invention.
Figure 11A:
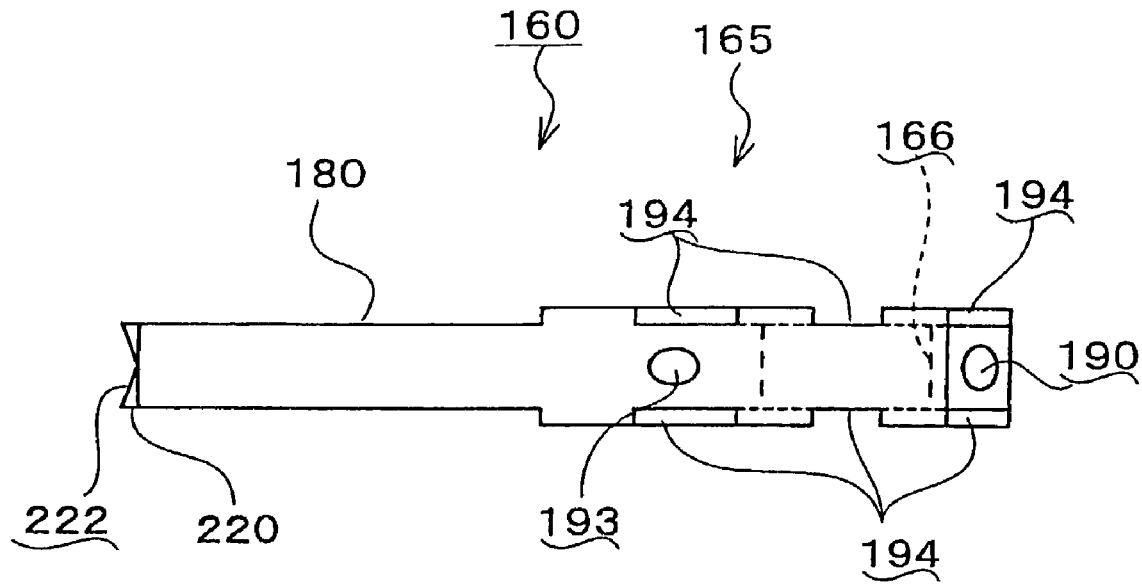
FIG. 11A is a plan view of the pressure piece in another embodiment.
Figure 11B:
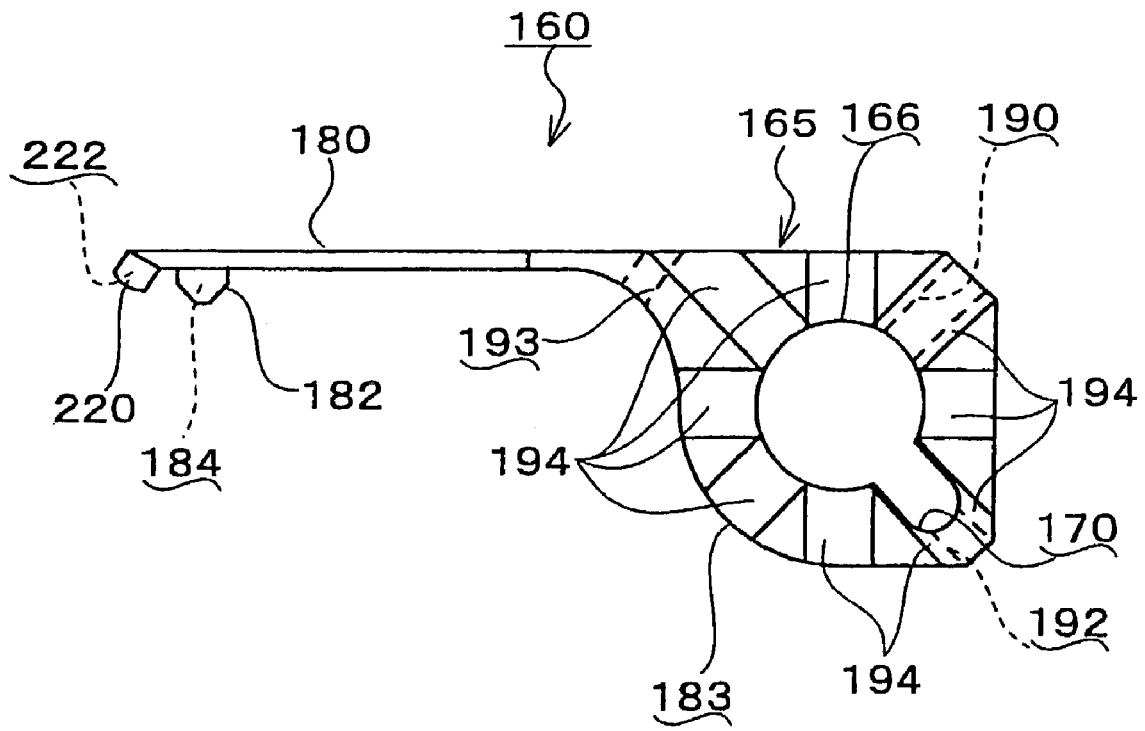
FIG. 11B is a side view of the pressure piece.

In view of FIG. 10, each pressure piece 160 may be arranged in a manner that the abutting part 182 is on the right side of the wafer W to the piece body 165. Then, as shown in FIGS. 11A and 11B, it is desirable to provide the pressure piece 160 with a guide part 220. The guide part 220 has a guide groove 222 formed with a substantial-V shaped section, thereby allowing the periphery of the wafer W to be inserted between opposing slanted faces defining the guide groove 222. In the pressure piece 160, the guide part 222 is arranged nearer to the tip of the piece body 165 than the abutting part 182. In view of FIG. 10, the guide part 222 is arranged underside the abutting part 182. With this arrangement, when inserting the wafers W into the rotor from below, it is possible to allow the peripheries of the wafers W to first abut on the guide parts 220 and successively introduce the peripheries of the wafers W into the holding grooves 184 of the abutting parts 182 smoothly.

Figure 12A:
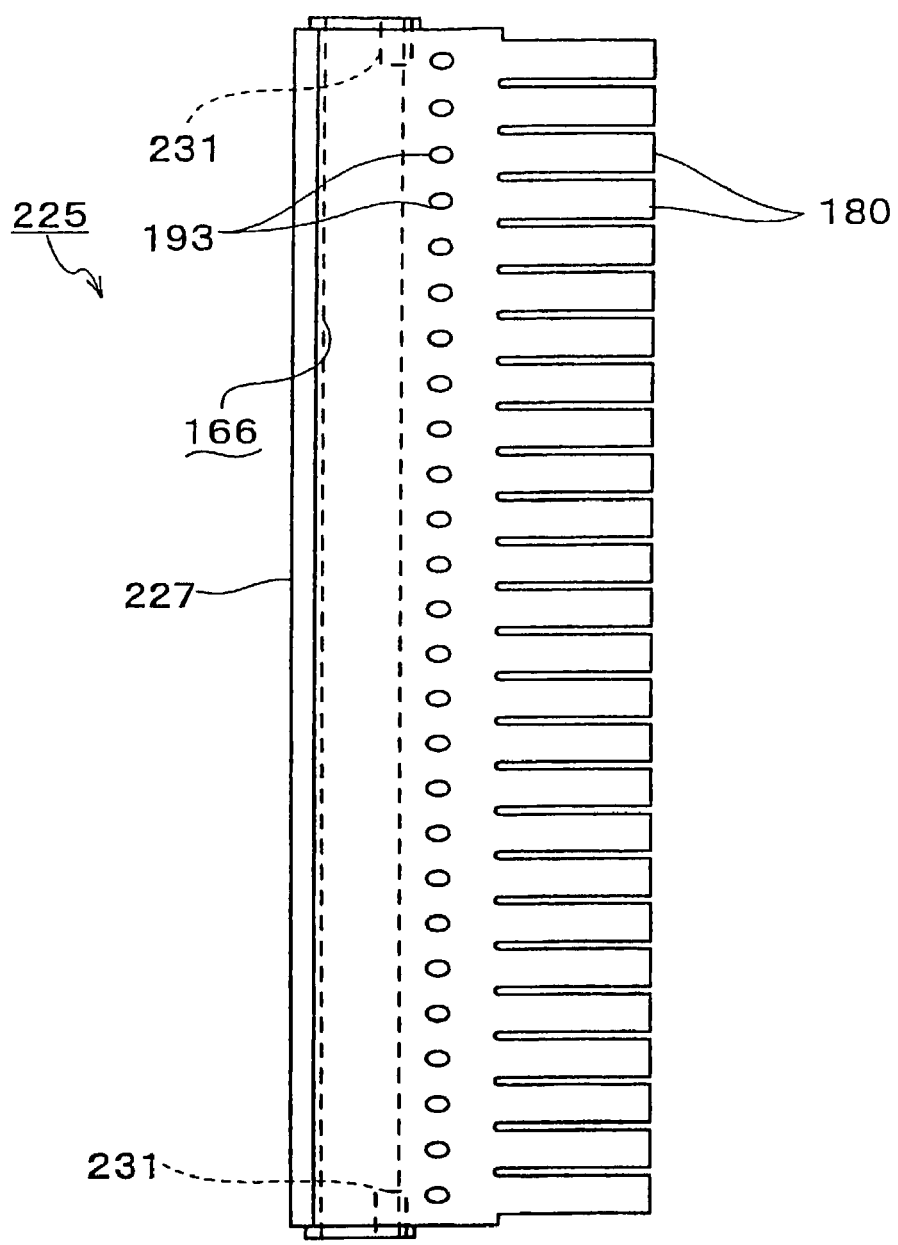
FIG. 12A is a plan view of a press member formed in one body.
Figure 12B:
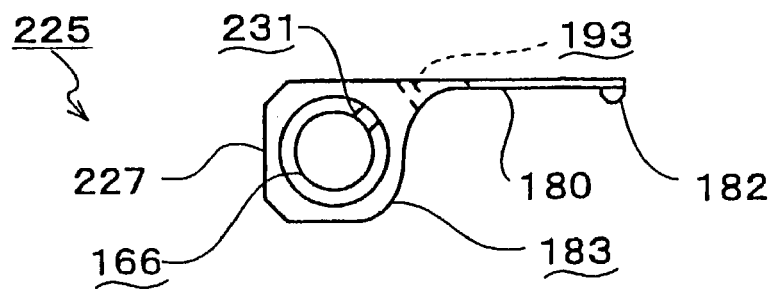
FIG. 12B is a side view of the press member.

Instead of forming a plurality of pressure pieces 160 individually, as shown in FIGS. 12A and 12B, there may be provided an integrated press member 225 having a plurality of abutting parts 182 for abutment on the peripheries of the wafers W. This press member 225 includes a body 227 having a rod fitting hole 166 penetrating therethrough and a plurality of deformable parts 180 in the form of beams projecting from the body 227, corresponding to the number of wafers W. Each deformable part 180 is provided, at a tip thereof, with the abutting part 182. In the press member 225, a plurality of drain holes 193 are juxtaposed to discharge liquid from a gap between the peripheries of the wafers W and the member 225 due to a centrifugal force. On both ends of the rod fitting hole 166, stopper inserting holes 231 are formed to allow an insertion of the stoppers 230 respectively. Here, in case of forming the plural pressure pieces 160 individually, it is possible to improve the processing accuracy of the pieces 160 easily in comparison with the press member 225. Thus, it is possible to reduce the manufacturing cost of the holding rod 95. Additionally, it is possible to adjust the pressures acting on the peripheries of the wafers W individually. While, the press member 225 has an advantage of collecting liquid in the circumference of the rod 161 with difficulty and therefore, there is no need to provide a drain path for discharging liquid collected in the circumference of the rod 161.

In the above-mentioned embodiment, one of the holding rods 95 to 100, that is, the holding rod 100 is provided with the constitution as the press member of the invention. In the modification, of course, the other holding rod may be provided with the similar constitution as the press member of the invention. Alternatively, a new holding rod having the constitution as the press member may be added to the existing holding rods.

According to the present invention, by exerting pressures on the peripheries of the substrates, it is possible to prevent the peripheries of the substrates from slipping in the holding grooves during the rotation of the substrate. Consequently, there is no possibility that the peripheries of the substrates are worn. Again, it is also possible to expand the span of life of the holding rods. It is possible to realize the application of appropriate pressures on the peripheries of the substrates respectively. Again, it is possible to accomplish the smooth insertion and extraction of the peripheries of the substrates to and from the holding grooves.

What is claimed is:

1. A substrate processing apparatus which includes a rotor for rotating a plurality of substrates paralleled to each other at proper intervals, for processing the substrates while rotating the substrates by the rotor, the rotor of the substrate processing apparatus comprising:

at least one holding member for holding the peripheries of the substrates in parallel arrangement; and at least one press member that is constructed so as to always apply a pressure on the peripheries of the substrates irrespective of a rotary and stationary state of the rotor, thereby holding the substrates so as to prevent the peripheries of the substrates from shifting with respect to the holding member, wherein the press member includes a plurality of pressure pieces arranged corresponding to the substrates respectively, and a rod for supporting the pressure pieces in a row, and wherein each of the pressure pieces has at least one drain hole for discharging liquid from the circumference of the rod due to a centrifugal force with the rotation of the rotor.

2. A substrate processing apparatus which includes a rotor for rotating a plurality of substrates paralleled to each other at proper intervals, for processing the substrates while rotating the substrates by the rotor, the rotor of the substrate processing apparatus comprising:

at least one holding member for holding the peripheries of the substrates in parallel arrangement;

at least one press member that is constructed so as to always apply a pressure on the peripheries of the substrates irrespective of a rotary and stationary state of the rotor, thereby holding the substrates so as to prevent the peripheries of the substrates from shifting with respect to the holding member, wherein the press member includes a plurality of pressure pieces arranged corresponding to the substrates respectively, and a rod for supporting the pressure pieces in a row; and a stopper that restricts the rotation of the pressure pieces, wherein each of the pressure pieces has at least one drain hole for discharging liquid from the circumference of the stopper with the rotation of the rotor, due to a centrifugal force thereof.

3. A substrate processing apparatus which includes a rotor for rotating a plurality of substrates paralleled to each other at proper intervals, for processing the substrates while rotating the substrates by the rotor, the rotor of the substrate processing apparatus comprising:

at least one holding member for holding the peripheries of the substrates in parallel arrangement; and at least one press member that is constructed so as to always apply a pressure on the peripheries of the substrates irrespective of a rotary and stationary state of the rotor, thereby holding the substrates so as to prevent the peripheries of the substrates from shifting with respect to the holding member, wherein the press member includes a plurality of pressure pieces arranged corresponding to the substrates respectively, and a rod for supporting the pressure pieces in a row, and wherein the pressure pieces are juxtaposed in a row while allowing opposing side faces of the adjoining pressure pieces abut on each other, and each of the side faces has at least one drain groove for discharging liquid from the circumference of the rod.

4. A substrate processing apparatus, according to claims 1, 2, or 3 wherein each of the pressure pieces has a piece body and a deformable part capable of elastic deformation including an abutting part for abutment on the periphery of a substrate and is constructed so that the movement of the abutting part due to pressing of the periphery of the substrate produces a deflection of the deformable part to produce the pressure of the press member.

5. A substrate processing apparatus as claimed in claim 4, wherein the deformable part of each of the pressure pieces has a substantial V-shaped groove formed to enable the periphery of the substrate to be inserted thereto, thereby holding the substrate, and a guide part to guide the periphery of the substrate before the V-shaped groove guides the periphery of the substrate to the abutting part.

6. A substrate processing apparatus as claimed in claim 4, wherein the piece body of each of the pressure pieces has an abutting face for abutting on the periphery of the substrate.

7. A substrate processing apparatus, according to claims 1, 2, or 3 wherein the pressure pieces are chemical resistant.

8. A substrate processing apparatus, according to claims 1, 2, or 3 wherein the pressure pieces are heat resistant.

9. A substrate processing apparatus, according to claims 1, 2, or 3 wherein the at least one holding member comprises a plurality of holding members, and at least one of the plurality of holding members is a movable holding member capable of moving between its opening position that allows the substrates to be loaded and unloaded to and from the rotor and the closing position that allows the substrates to be retained in the rotor.

10. A substrate processing apparatus which includes a rotor for rotating a plurality of substrates paralleled to each other at proper intervals, for processing the substrates while rotating the substrates by the rotor, the rotor of the substrate processing apparatus comprising:

at least one holding member for holding the peripheries of the substrates in parallel arrangement; and at least one press member that is constructed so as to always apply a pressure on the peripheries of the substrates irrespective of a rotary and stationary state of the rotor, thereby holding the substrates so as to prevent the peripheries of the substrates from shifting with respect to the holding member, wherein the press member includes a rod extending in a direction to arrange the substrates and a pressure piece fitted to the rod, and the pressure piece includes a piece body cylindrically shaped so as to surround the rod and extending in the direction to arrange the substrates and a plurality of deformable parts formed to project from the piece body in correspondence with the substrates, the deformable parts being deformable against the piece body, and the pressure piece has at least one drain hole for discharging liquid from an interval between the periphery of the substrate and the pressure piece with the rotation of the rotor, due to a centrifugal force thereof.

11. A substrate processing apparatus as claimed in claim 10, wherein the piece body has an abutting face for abutment on the peripheries of the substrates, and the deformable parts are provided, at respective tips thereof, with abutting parts for pressing the peripheries of the substrates.

* * * * *